US011641071B2

(12) United States Patent
Liew et al.

(10) Patent No.: US 11,641,071 B2
(45) Date of Patent: May 2, 2023

(54) CONNECTION ASSEMBLY AND PIN WITH A WELDING SECTION

(71) Applicants: TE Connectivity Services GmbH, Schaffhausen (CH); Tyco Electronics Canada ULC, Markham (CA)

(72) Inventors: Yiyang Liew, Winston Salem, NC (US); Lucian Iordache, Markham (CA); Mark Rice, Winston Salem, NC (US); Earl Daniel Swope, Winston Salem, NC (US); Georg Friesen, Winston Salem, NC (US)

(73) Assignees: TE CONNECTIVITY SOLUTIONS GMBH, Schaffhausen (CH); TYCO ELECTRONICS CANADA ULC, Markham (CA)

( * ) Notice: Subject to any disclaimer, the term of this patent is extended or adjusted under 35 U.S.C. 154(b) by 0 days.

(21) Appl. No.: 17/147,999

(22) Filed: Jan. 13, 2021

(65) Prior Publication Data
US 2021/0218165 A1 Jul. 15, 2021

Related U.S. Application Data

(60) Provisional application No. 62/960,478, filed on Jan. 13, 2020.

(51) Int. Cl.
*H01R 12/58* (2011.01)
*H05K 5/00* (2006.01)
*H01R 43/02* (2006.01)
*H05K 1/18* (2006.01)
*G01F 23/263* (2022.01)
*H01R 4/02* (2006.01)

(52) U.S. Cl.
CPC ........... *H01R 12/58* (2013.01); *G01F 23/263* (2013.01); *H01R 43/0263* (2013.01); *H05K 1/18* (2013.01); *H05K 5/0039* (2013.01); *H05K 5/0052* (2013.01); *H01R 4/029* (2013.01); *H05K 5/0056* (2013.01); *H05K 2201/1059* (2013.01); *H05K 2201/10151* (2013.01); *H05K 2201/10257* (2013.01); *H05K 2201/10272* (2013.01); *H05K 2201/10371* (2013.01)

(58) Field of Classification Search
CPC ....... H01R 12/58; H01R 4/029; G01F 23/263; H05K 1/18; H05K 5/0039; H05K 5/0052; H05K 5/0056; H05K 2201/10151; H05K 2201/10257; H05K 2201/10272; H05K 2201/10371; H05K 2201/1059
USPC ........................................................ 174/260
See application file for complete search history.

(56) References Cited

U.S. PATENT DOCUMENTS

| | | | | |
|---|---|---|---|---|
| 11,152,723 B2* | 10/2021 | Eicher | ...................... | H01R 4/58 |
| 2006/0264076 A1* | 11/2006 | Chen | .................... | H01R 12/585 |
| | | | | 439/82 |
| 2008/0166132 A1* | 7/2008 | Lynde | ................... | E21B 47/002 |
| | | | | 398/142 |
| 2013/0337697 A1* | 12/2013 | Buschel | ................. | H01R 12/58 |
| | | | | 439/660 |
| 2014/0140779 A1* | 5/2014 | Becker | ................ | B29C 66/0326 |
| | | | | 407/1 |

(Continued)

*Primary Examiner* — Andargie M Aychillhum

(57) ABSTRACT

A pin has a compliant section at a first end and a welding section at a second end opposite the first end. The compliant section is electrically connected with a via of a printed circuit board. The welding section has a welded connection with a passive component.

23 Claims, 6 Drawing Sheets

(56) References Cited

U.S. PATENT DOCUMENTS

2016/0211199 A1* 7/2016 Hagiwara ......... H01L 23/49517
2020/0036118 A1* 1/2020 Su ..................... H05K 1/184
2021/0036442 A1* 2/2021 Eicher ................ H01R 4/58

* cited by examiner

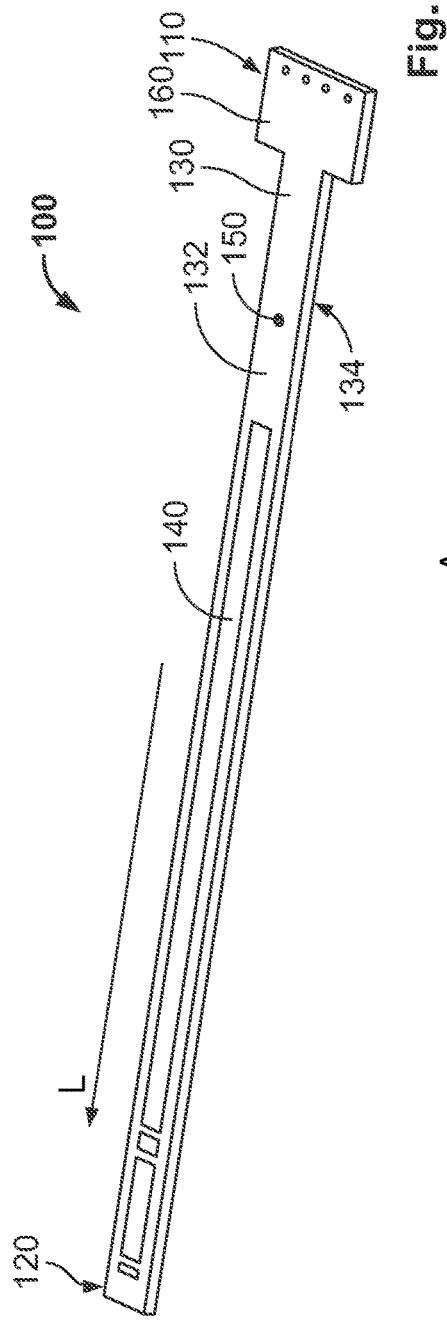
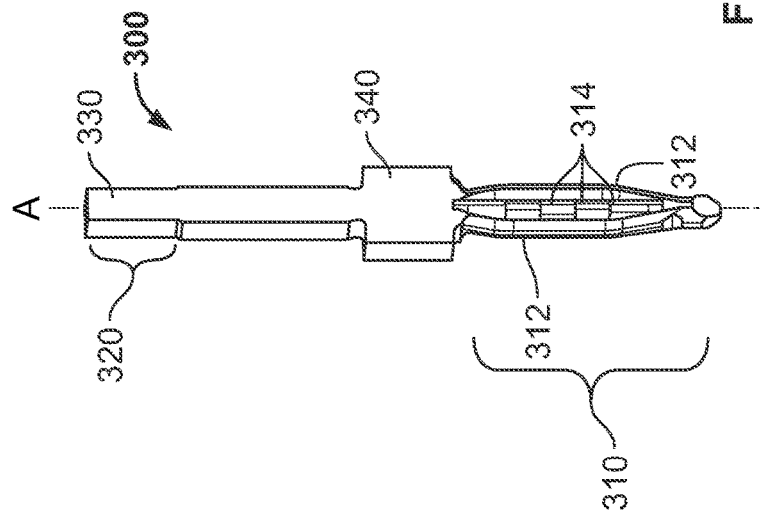

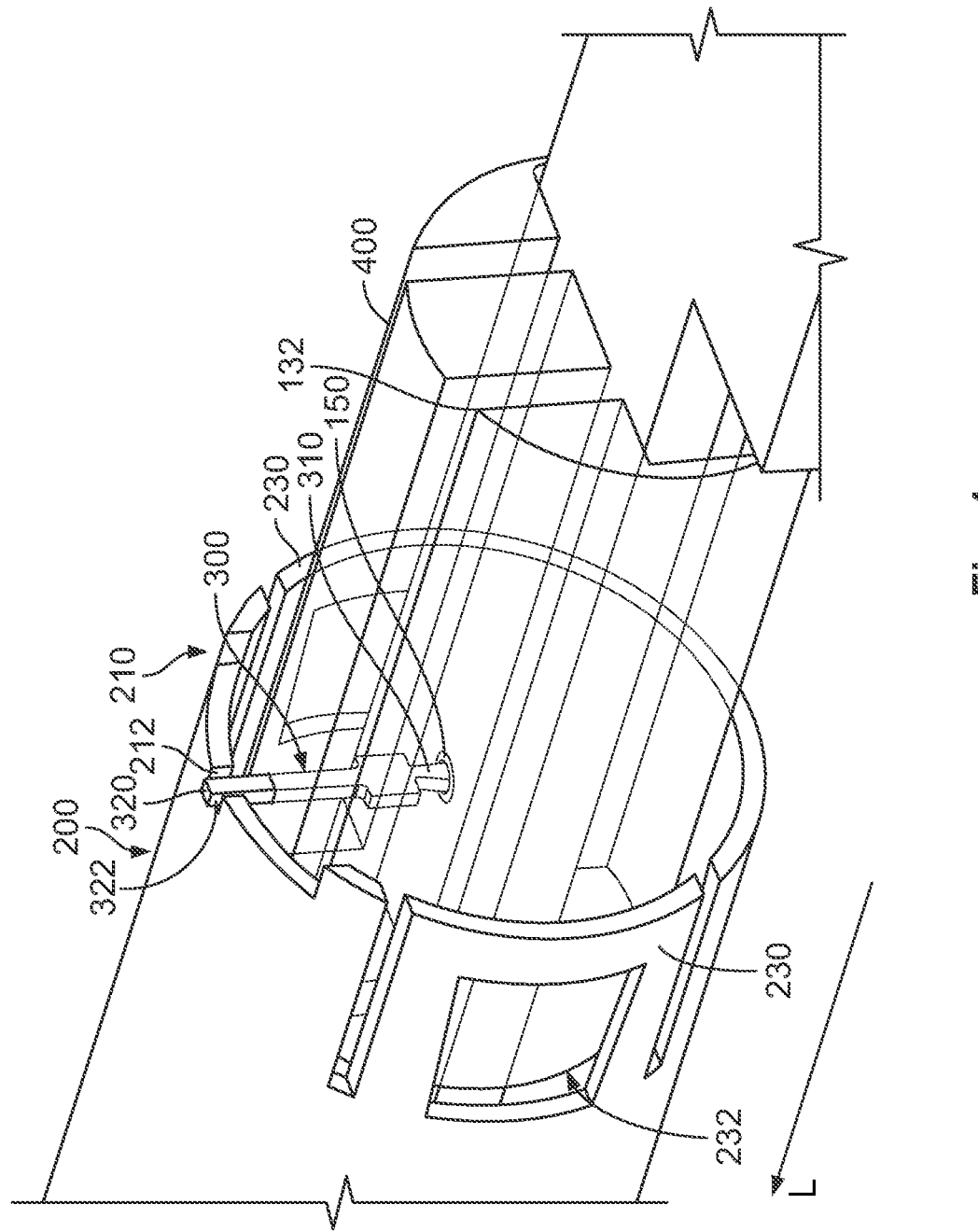

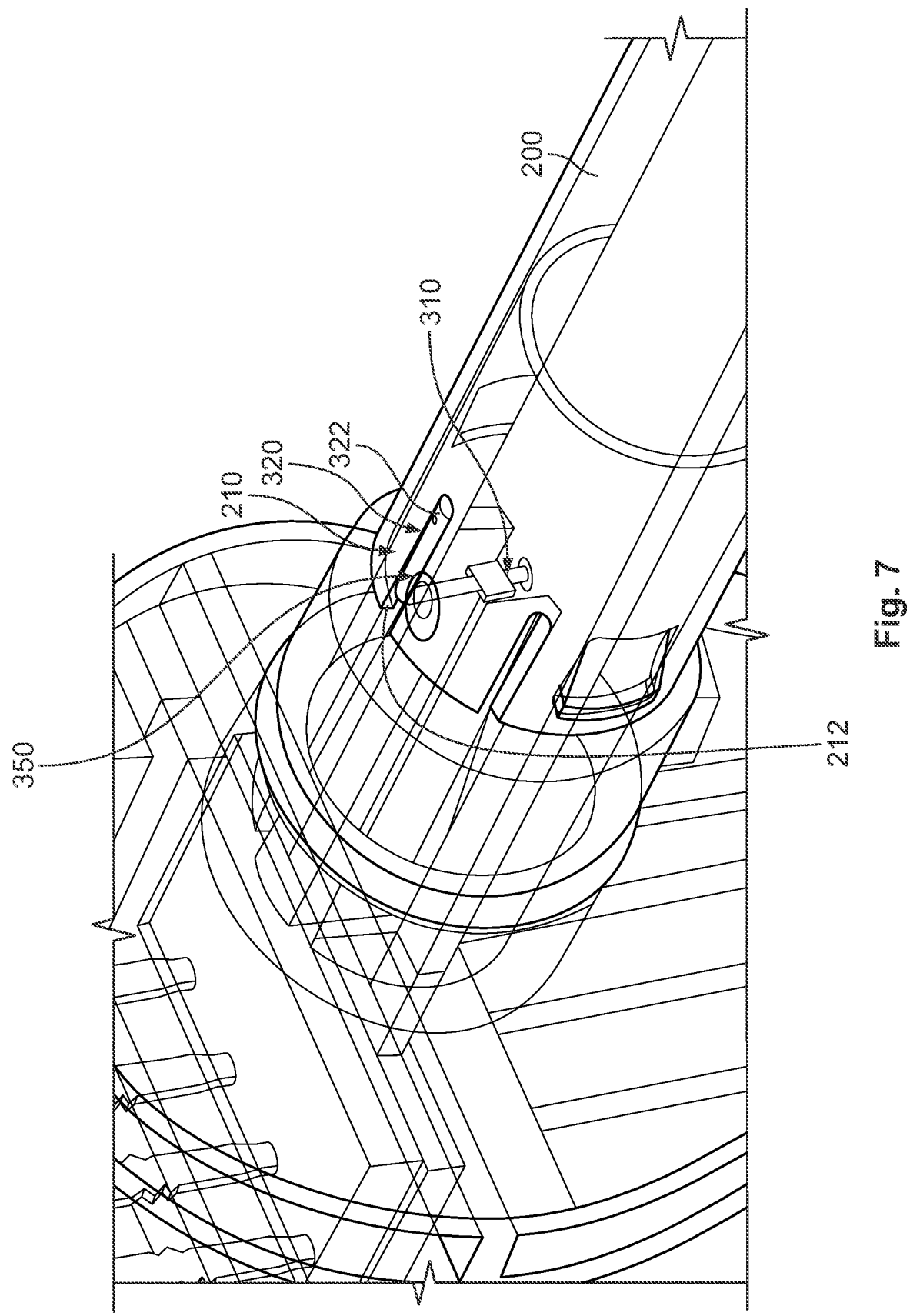

CONNECTION ASSEMBLY AND PIN WITH A WELDING SECTION

CROSS-REFERENCE TO RELATED APPLICATION

This application claims priority under 35 U.S.C. § 119 to U.S. Provisional Patent Application No. 62/960,478, filed on Jan. 13, 2020.

FIELD OF THE INVENTION

The present invention relates to a pin of a connection assembly and, more particularly, to a pin electrically connecting a printed circuit board with a passive component.

BACKGROUND

Certain capacitive sensors, for example liquid level sensors, have an electrode on a printed circuit board (PCB) and an electrode on a passive component adjacent to the PCB. Increasing a size of an air gap between the electrodes improves the usability of the capacitive sensor in a variety of sensing applications.

Increasing the air gap between the electrodes, however, also complicates the formation of electrical continuity between the PCB and the passive component. The electrical connection must bridge the gap while maintaining the electrical continuity between the electrodes in harsh conditions, such as in applications subjecting the connection to vibration and/or exposing the connection to environments that could corrode or otherwise impair the electrical connection. Current electrical connections between the electrodes, for example through the use of spring contacts, are either insufficiently robust to maintain the electrical continuity in a range of applications or are difficult and expensive to manufacture.

SUMMARY

A pin has a compliant section at a first end and a welding section at a second end opposite the first end. The compliant section is electrically connected with a via of a printed circuit board. The welding section has a welded connection with a passive component.

BRIEF DESCRIPTION OF THE DRAWINGS

The invention will now be described by way of example with reference to the accompanying Figures, of which:

FIG. 2 is a perspective view of a printed circuit board of the connection assembly;

FIG. 3 is a perspective view of a pin of the connection assembly;

FIG. 4 is a detail perspective view of the pin, the circuit board, a passive component, and a potting of the connection assembly;

FIG. 7 is a detail perspective view of a connection assembly according to another embodiment.

DETAILED DESCRIPTION OF THE EMBODIMENT(S)

Figure 1:
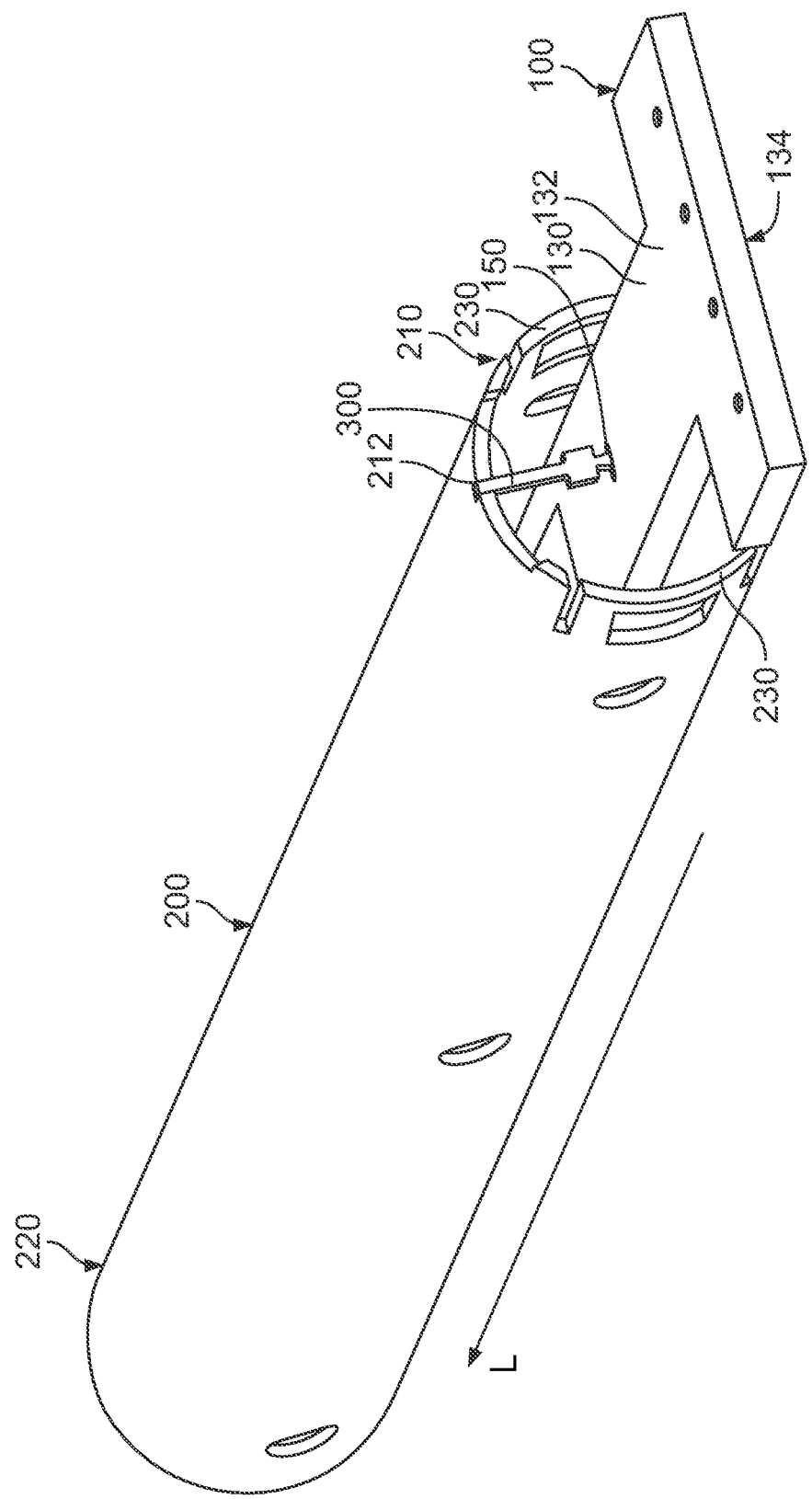
FIG. 1 is a perspective view of a connection assembly according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art. In addition, in the following detailed description, for purposes of explanation, numerous specific details are set forth in order to provide a thorough understanding of the disclosed embodiments. However, it is apparent that one or more embodiments may also be implemented without these specific details.

A connection assembly according to an embodiment, as shown in FIG. 1, comprises a printed circuit board (PCB) 100, a passive component 200, and a pin 300 electrically connecting the PCB 100 with the passive component 200.

The PCB 100, as shown in FIGS. 1 and 2, is an elongated component that extends from a first end 110 to a second end 120 along a longitudinal direction L. The PCB 100 includes a substrate 130 and a circuitry 140 disposed on and/or within the substrate 130. The substrate 130 is flat and has a first surface 132 and an opposite second surface 134. The PCB 100 includes a via 150 extending through the substrate 130 from the first surface 132 to the second surface 134. A conductive plating of the via 150 is electrically connected to the circuitry 140.

In an embodiment, as shown in FIG. 2, the PCB 100 has a conformal coating 160. In an embodiment, the conformal coating 160 covers an entirety of the substrate 130. In various embodiments, the conformal coating 160 may be an acrylic polyurethane.

The passive component 200, as shown in FIGS. 1 and 4, is a formed of metal. The passive component 200 may be a metal sheet, a metal bar, or any other form of conductive material capable of acting as a passive component that is electrically conductive. In the shown embodiment, the passive component 200 is a cylindrical metal tube extending from a first end 210 to a second end 220 along the longitudinal direction L. In an embodiment, the passive component 200 is formed of a stainless steel material. In other embodiments, passive component 200 may be formed of any other type of metal capable of acting as an electrically conductive passive component.

The first end 210 of the passive component 200, as shown in FIGS. 1 and 4, has a notch 212 extending into the first end 210. In the shown embodiment, the notch 212 has an approximately square shape. In other embodiments, the notch 212 may have any other polygonal shape, such as a rectangular shape or a triangular shape, or any other curved shape, such as a half-circle or a portion of an ellipse, for example.

The first end 210 of the passive component 200, in the embodiment shown in FIGS. 1 and 4, has at least one latching tab 230. In the shown embodiment, the passive component 200 has a pair of latching tabs 230 positioned opposite one another around a circumference of the first end 210. Each of the latching tabs 230 is partially cut-away from the passive component 200, extends along the longitudinal direction L, and is elastically deflectable in a radial direction transverse to the longitudinal direction L. Each of the latching tabs 230 has a recess 232 extending through the latching tab 230.

The pin 300, as shown in FIGS. 1 and 3, has a compliant section 310 at a first end and a welding section 320 at a second end opposite the first end. The pin 300 is integrally formed of a conductive material. In an embodiment, the pin 300 is formed of a copper alloy material.

The compliant section 310, as shown in FIGS. 1, 3, and 4, has a weakened structure in comparison with a remainder of the pin 300. The compliant section 310 is resilient and capable of deforming under an external load in a direction perpendicular to an axis A of the pin 300. In the embodiment shown in FIG. 3, the compliant section 310 includes a pair of beams 312 connected by a plurality of sheets 314; the sheets 314 are separated from one another and deform when the beams 312 are pressed toward each other. In another embodiment, the compliant section 310 includes the pair of beams 312 with an open space between the beams 312. In other embodiments, the compliant section 310 may have any compliant structure that resiliently deforms such as, for example, those used in press-fit applications.

The welding section 320, as shown in FIGS. 3 and 4, is a solid section of a material of the pin 300. In the shown embodiment, the welding section 320 has a square cross-section. In other embodiments, the welding section 320 may have any polygonal cross-section or any curved cross-section.

In the embodiment shown in FIG. 3, the pin 300 has a coating 330 covering at least the welding section 320. The coating 330 includes nickel and, in an embodiment, is a nickel-silver plating.

As shown in FIG. 3, the pin 300 has a shoulder 340 disposed between the compliant section 310 and the welding section 320. The shoulder 340 is formed of a solid section of a material of the pin 300 and has a width greater than a width of a remainder of the pin 300 in a direction perpendicular to the axis A of the pin 300.

The assembly of the pin 300 with the PCB 100 and the passive component 200 to electrically connect the PCB 100 and the passive component 200 will now be described in greater detail primarily with reference to FIGS. 1 and 4.

The pin 300, as shown in FIGS. 1 and 4, is inserted into the via 150 of the PCB 100. The compliant section 310 is press-fit into the via 150; a surface of the via 150 abuts and deforms the compliant section 310 as the compliant section 310 is pressed into the via 150. When fully inserted, the compliant section 310 resiliently abuts the conductive plating of the via 150 and electrically connects the pin 300 to the via 150. The shoulder 340 limits a possible depth of insertion of the pin 300 into the via 150.

As shown in FIG. 4, after the compliant section 310 is press-fit into the via 150, in an embodiment a potting 400 is applied on the first surface 132 of the substrate 130 surrounding the via 150 and a portion of the pin 300. The potting 400 is shown transparent in FIG. 4 in order to also show the connection of the compliant section 310 to the via 150. The potting 400 covers and seals the connection between the compliant section 310 and the via 150 to prevent the ingress of environmental materials that could impair or degrade the electrical connection. The potting 400, in various embodiments, can be a hard potting material such as an epoxy, a soft potting material such as a silicone, a polyamide material in the case of a low pressure hot melt overmold, or any other type of potting suitable to seal the connection of the compliant section 310 and the via 150.

With the compliant section 310 press-fit into the via 150, as shown in FIG. 4, the welding section 320 is welded to the passive component 200 to form a welded connection 322. In various embodiments, the welded connection 322 can be a laser weld, a resistance weld, or a tungsten inert gas (TIG) weld. The welded connection 322 forms an intermetallic bond between the welding section 320 and the passive component 200, also forming an electrical connection between the pin 300 and the passive component 200.

The pin 300 thereby electrically connects the PCB 100, including the circuitry 140 of the PCB 100, to the passive component 200 through the press-fit into the PCB 100 and the welded connection 322 with the passive component 200.

As shown in the embodiment of FIGS. 1 and 4, the welding section 320 is positioned in the notch 212 at the first end 210 of the passive component 200. The welded connection 322 is formed where the welding section 320 abuts the passive component 200 in the notch 212. The shape of the notch 212 corresponds to the cross-sectional shape of the welding section 320, facilitating a robust welded connection 322.

In the shown embodiment, prior to the formation of the welded connection 322, the second end 120 of the PCB 100 is inserted into the cylindrical metal tube of the passive component 200. The cylindrical metal tube of the passive component 200 surrounds the PCB 100. In other embodiments, the passive component 200 can be disposed adjacent a side of the PCB 100 and does not necessarily surround the PCB 100.

In an embodiment, as shown in FIGS. 5 and 6A-6C, the connection assembly includes a housing 500 in which the PCB 100 is disposed and to which the passive component 200 is attached. The housing 500 and the passive component 200 are shown transparent in FIGS. 6A-6C for ease of understanding.

The housing 500, as shown in FIGS. 5 and 6A-6C, includes a base 510 and a port 520 extending from the base 510 in the longitudinal direction L. Each of the base 510 and the port 520 define an interior space, and the interior space of the base 510 communicates with the interior space of the port 520. The housing 500 is formed of an electrically insulating material.

Figure 5:
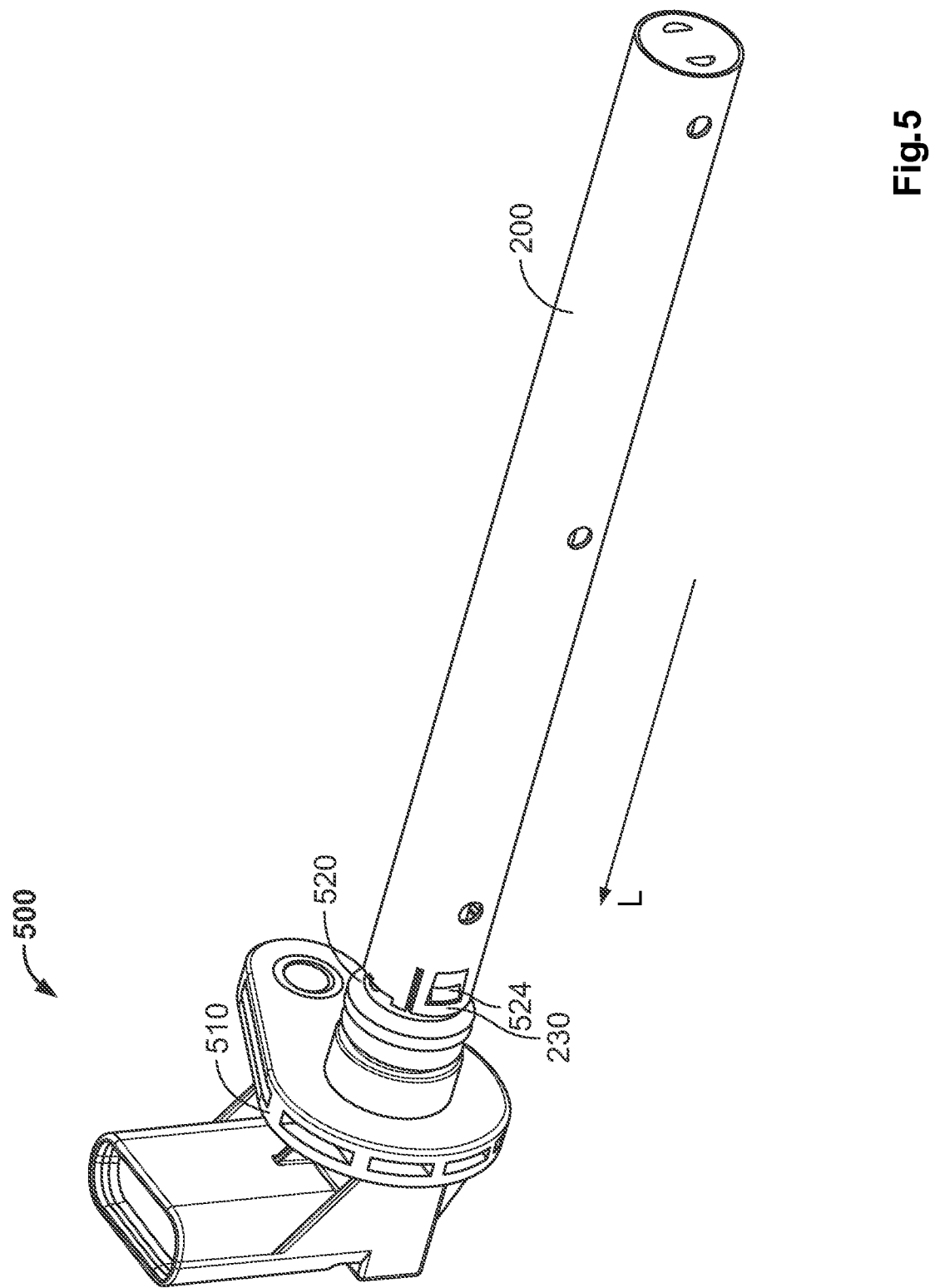
FIG. 5 is a perspective view of a connection assembly according to another embodiment.
Figure 6A:
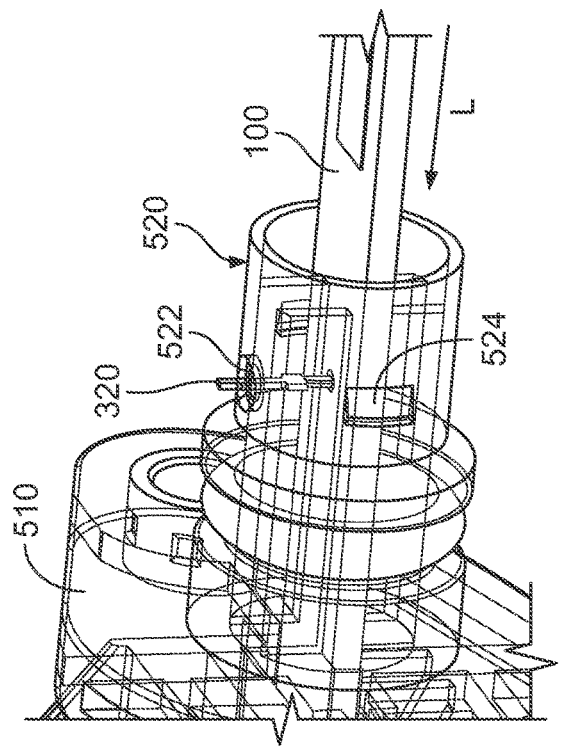
FIG. 6A is a detail perspective view of a first step of a process of assembling the connection assembly of FIG. 5.
Figure 6B:
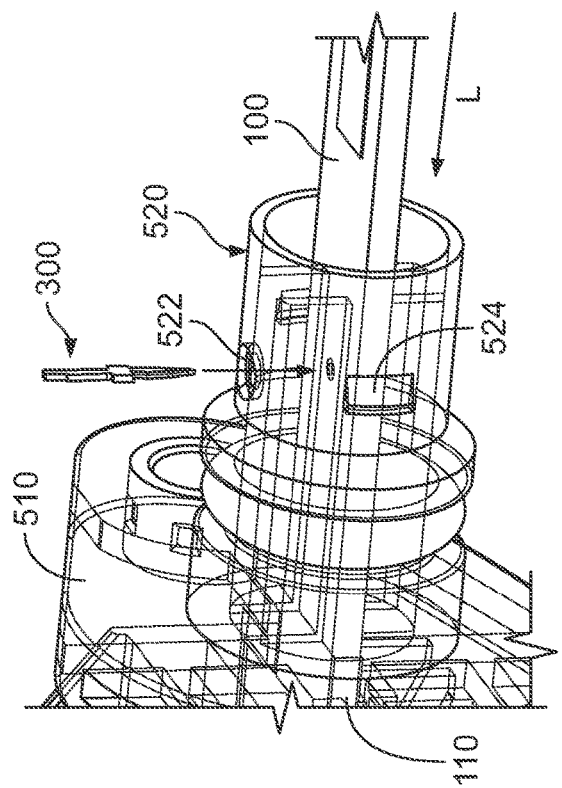
FIG. 6B is a detail perspective view of a second step of a process of assembling the connection assembly of FIG. 5.
Figure 6C:
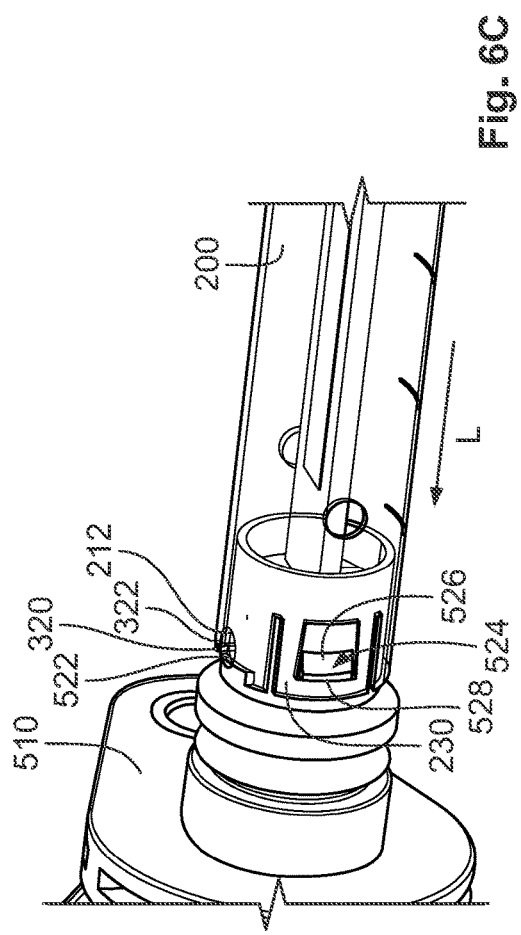
FIG. 6C is a detail perspective view of a third step of a process of assembling the connection assembly of FIG. 5.

The port 520, as shown in FIGS. 5 and 6A-6C, has a passageway 522 extending through the port 520 in a direction perpendicular to the longitudinal direction L and at least one catch 524 disposed on an outer surface of the port 520. In the shown embodiment, the port 520 has a pair of catches 524 disposed opposite one another. Each catch 524, as shown in FIG. 6C, has a ramp 526 with a surface positioned progressively further from the outer surface of the port 520 moving along the longitudinal direction L and a stop 528 disposed at an end of the ramp 526 in the longitudinal direction L.

A process of assembling the PCB 100, the passive component 200, and the pin 300 with the housing 500 to electrically connect the PCB 100 and the passive component 200 will now be described in greater detail with reference to FIGS. 6A-6C.

As shown in FIG. 6A, the first end 110 of the PCB 100 is positioned in the base 510 of the housing 500. The PCB 100 extends out of the housing 500 through the port 520, with the second end 120 positioned outside of the housing 500, and is positioned with the via 150 aligned with the passageway 522.

The pin 300, as shown in FIGS. 6A and 6B, is inserted through the passageway 522 and into the via 150 to electrically connect the compliant section 310 with the via 150 as described in detail above. When the pin 300 is fully inserted, as shown in FIG. 6B, the welding section 320 protrudes beyond the outer surface of the port 520.

As shown in FIG. 6C, the passive component 200 is positioned to surround the PCB 100 and is moved in the longitudinal direction L into engagement with the port 520. The latching tabs 230 contact the catches 524 and ride up the ramps 526 as the passive component 200 is moved in the longitudinal direction L. The latching tabs 230 deflect further as they move along the ramps 526 until they reach the stops 528, where they elastically restore to an initial position at the stops 528. The catches 524 are positioned in the recesses 232 of the latching tabs 230 when the passive component 200 is fully positioned on the port 520, holding the passive component 200 on the port 520 by engagement of the latching tabs 230 with the catches 524.

When the passive component 200 is in a fully engaged position on the port 520, as shown in FIG. 6C, the notch 212 is aligned with the passageway 522 such that the welding section 320 protruding beyond the port 520 is positioned in the notch 212. The welding described in detail above forming the welded connection 322 electrically connecting the pin 300 and the passive component 200 can then take place.

The embodiment of the connection assembly shown in FIG. 5 is adapted for use as a liquid level sensor. The PCB 100, the passive component 200, and the pin 300 electrically connecting the PCB 100 and the passive component 200 in this embodiment act as a capacitive fluid sensor, with a liquid disposed between the PCB 100 and the passive component 200. The welded connection 322 forms a robust intermetallic electrical connection that resists corrosion by the liquid and ensures contact between the PCB 100 and passive component 200 even when the liquid is disposed around the pin 300.

The connection assembly is not restricted to use in a liquid level sensor. In other embodiments, the connection assembly can be part of a connector with the passive component 200 acting as an electromagnetic shield, or the passive component 200 could act a bus bar connected to the PCB 100 in a different application. The connection assembly is applicable to any embodiment using the pin 300 to electrically connect the PCB 100 to the passive component 200 through the press-fit into the PCB 100 and the welded connection 322 with the passive component 200.

A connection assembly according to another embodiment is shown in FIG. 7. Like reference numbers refer to like elements, and only the differences from the embodiments described above will be described in detail herein.

In the embodiment shown in FIG. 7, the pin 300 has a bent section 350 disposed between the compliant section 310 and the welding section 320. In the shown embodiment, the bent section 350 extends approximately perpendicular to the compliant section 310. In other embodiments, the bent section 350 could extend at an acute angle or an obtuse angle with respect to the compliant section 310.

The bent section 350 of the pin 300 extends through the notch 212 at the first end 210 of the passive component 200, as shown in FIG. 7. In this embodiment, the welding section 320 extends in the longitudinal direction L along an outer surface of the passive component 200 and abuts against the outer surface of the passive component. The welded connection 322 is formed between the welding section 320 and the outer surface of the passive component 200.

What is claimed is:

1. A pin, comprising:
   a compliant section at a first end electrically connected with a via of a printed circuit board;
   a welding section at a second end opposite the first end, the welding section is integrally formed with the compliant section, the welding section having a welded connection with a passive component; and
   a bent section between the compliant section and the welding section, the welding section extends approximately perpendicular to the complaint section.

2. The pin of claim 1, wherein the welded connection is a laser weld, a resistance weld, or a tungsten inert gas weld.

3. The pin of claim 1, wherein the pin has a shoulder between the compliant section and the welding section.

4. The pin of claim 1, wherein the pin has a coating on the welding section.

5. A connection assembly, comprising:
   a printed circuit board having a via;
   a passive component; and
   a pin having a compliant section at a first end and a welding section at a second end opposite the first end, the welding section is integrally formed with the compliant section, the compliant section is press-fit into the via, the welding section has a welded connection with the passive component.

6. The connection assembly of claim 5, wherein the pin electrically connects a circuitry of the printed circuit board to the passive component.

7. The connection assembly of claim 5, wherein the compliant section resiliently abuts a conductive plating of the via.

8. The connection assembly of claim 7, further comprising a potting disposed on a surface of a substrate of the printed circuit board and surrounding a portion of the pin.

9. The connection assembly of claim 8, wherein the printed circuit board has a conformal coating covering an entirety of the substrate.

10. The connection assembly of claim 5, wherein the passive component is a metal sheet or a metal bar.

11. The connection assembly of claim 10, wherein the passive component is a cylindrical metal tube surrounding the printed circuit board.

12. The connection assembly of claim 5, wherein the passive component has a notch disposed at an end.

13. The connection assembly of claim 12, wherein the welding section is disposed in the notch and the welded connection is formed in the notch.

14. The connection assembly of claim 13, wherein the notch has a shape corresponding to a cross-sectional shape of the welding section.

15. The connection assembly of claim 5, wherein the pin has a bent section between the compliant section and the welding section, the welding section abuts and extends along a surface of the passive component.

16. The connection assembly of claim 5, further comprising a housing, the printed circuit board is disposed in the housing and the passive component is attached to the housing.

17. The connection assembly of claim 16, wherein the housing has a base and a port extending from the base, the printed circuit board is positioned in the base and extends out of the housing through the port.

18. The connection assembly of claim 17, wherein the port has a passageway extending through the port in a direction perpendicular to a longitudinal direction of the printed circuit board, the passageway is aligned with the via, the pin is disposed in the passageway and the welding section protrudes beyond an outer surface of the port.

19. The connection assembly of claim 17, wherein the port has a catch and the passive component has a latching tab resiliently engaging the catch.

20. A connection assembly, comprising:
- a printed circuit board having a via;
- a passive component;
- a housing, the printed circuit board is disposed in the housing and the passive components is attached to the housing; and
- a pin having a compliant section at a first end and a welding section at a second end opposite the first end, the compliant section is press-fit into the via, the welding section has a welded connection with the passive component.

21. The connection assembly of claim 20, wherein the housing has a base and a port extending from the base, the printed circuit board is positioned in the base and extends out of the housing through the port.

22. The connection assembly of claim 21, wherein the port has a passageway extending through the port in a direction perpendicular to a longitudinal direction of the printed circuit board, the passageway is aligned with the via, the pin is disposed in the passageway and the welding section protrudes beyond an outer surface of the port.

23. The connection assembly of claim 21, wherein the port has a catch and the passive component has a latching tab resiliently engaging the catch.

\* \* \* \* \*